United States Patent
Manning (10) Patent No.: US 6,321,316 B1
(45) Date of Patent: *Nov. 20, 2001

(54) METHOD AND APPARATUS FOR LOCAL CONTROL SIGNAL GENERATION IN A MEMORY DEVICE

(75) Inventor: Troy A. Manning, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/444,108

(22) Filed: Nov. 22, 1999

Related U.S. Application Data (63) Continuation of application No. 08/877,957, filed on Jun. 18, 1997, now Pat. No. 6,009,501.

(51) Int. Cl.⁷ .............. G06F 13/00; G06F 1/10; G11C 11/413
(52) U.S. Cl. .............. 711/167; 711/5; 365/233; 365/230.03; 713/500
(58) Field of Search .................. 711/167, 154, 711/5; 365/230.03, 233; 713/500, 503, 600

(56) References Cited

U.S. PATENT DOCUMENTS

| | | | |
|---|---|---|---|
| 5,072,424 | 12/1991 | Brent et al. | 365/189.01 |
| 5,159,572 | 10/1992 | Morton | 365/230.06 |
| 5,202,857 | 4/1993 | Yanai et al. | 365/233 |
| 5,323,360 | 6/1994 | Pelley, III | 365/233.5 |
| 5,598,376 | 1/1997 | Merritt et al. | 365/230.06 |
| 5,636,173 | 6/1997 | Schaefer | 365/230.03 |
| 5,757,715 | 5/1998 | Williams et al. | 365/230.03 |
| 5,771,199 | 6/1998 | Lee | 365/230.03 |
| 5,774,409 | 6/1998 | Yamazaki et al. | 365/230.03 |
| 5,781,496 | 7/1998 | Pinkham et al. | 365/230.03 |
| 5,825,711 | 10/1998 | Manning | 365/230.03 |
| 5,841,731 | 11/1998 | Shinozaki | 365/233 |
| 5,870,350 | 2/1999 | Bertin et al. | 365/233 |
| 5,987,576 | * 11/1999 | Johnson et al. | 711/167 |
| 6,032,220 | 2/2000 | Martin et al. | 711/5 |

FOREIGN PATENT DOCUMENTS 0 640 985 A2   3/1995  (EP).

OTHER PUBLICATIONS

Anonymous, "400MHz SLDRAM, 4M X 16 SLDRAM Pipelined, Eight Bank, 2.5 V Operation," SLDRAM Consortium Advance Sheet, published throughout the United States, pp. 1–22.

Anonymous, "Draft Standard for a High–Speed Memory Interface (SyncLink),"Microprocessor and Microcomputer Standards Subcommittee of the IEEE Computer Society, Copyright 1996 by the Institute of Electrical and Electronics Engineers, Inc., New York, NY, pp. 1–56.

* cited by examiner

Primary Examiner—Glenn Gossage
(74) Attorney, Agent, or Firm—Dorsey & Whitney LLP (57) ABSTRACT

A computer system with a memory device having plural memory banks and a method of accessing a selected one of the memory banks, the memory device includes local control signal generators that control timing of operations in each respective block of a memory array. Overall timing of the device is controlled by first and second global control signals generated in a command sequencer and decoder. The second global control signal is derived from a delayed version of the first signal, and both signals are applied to local control signal generators along with address bits indicating a selected block. Local timing is determined by the global control signals and by local circuitry within the local control signal generators.

31 Claims, 5 Drawing Sheets

METHOD AND APPARATUS FOR LOCAL CONTROL SIGNAL GENERATION IN A MEMORY DEVICE

CROSS-REFERENCE TO RELATED APPLICATION

This application is a continuation of U.S. patent application Ser. No. 08/877,957, filed Jun. 18, 1997, now U.S. Pat. No. 6,009,501.

TECHNICAL FIELD

The present invention relates to memory devices, and more particularly, to command generation in memory devices.

BACKGROUND OF THE INVENTION

Conventional computer systems include a processor coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors are currently available that operate at clock speeds of at least 200 megahertz. However, the remaining components of the computer system, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a frequency that is substantially lower than the clock frequency of the processor. Currently, for example, a processor having a 200 MHz clock frequency may be mounted on a motherboard having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, typical SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

Figure 1:
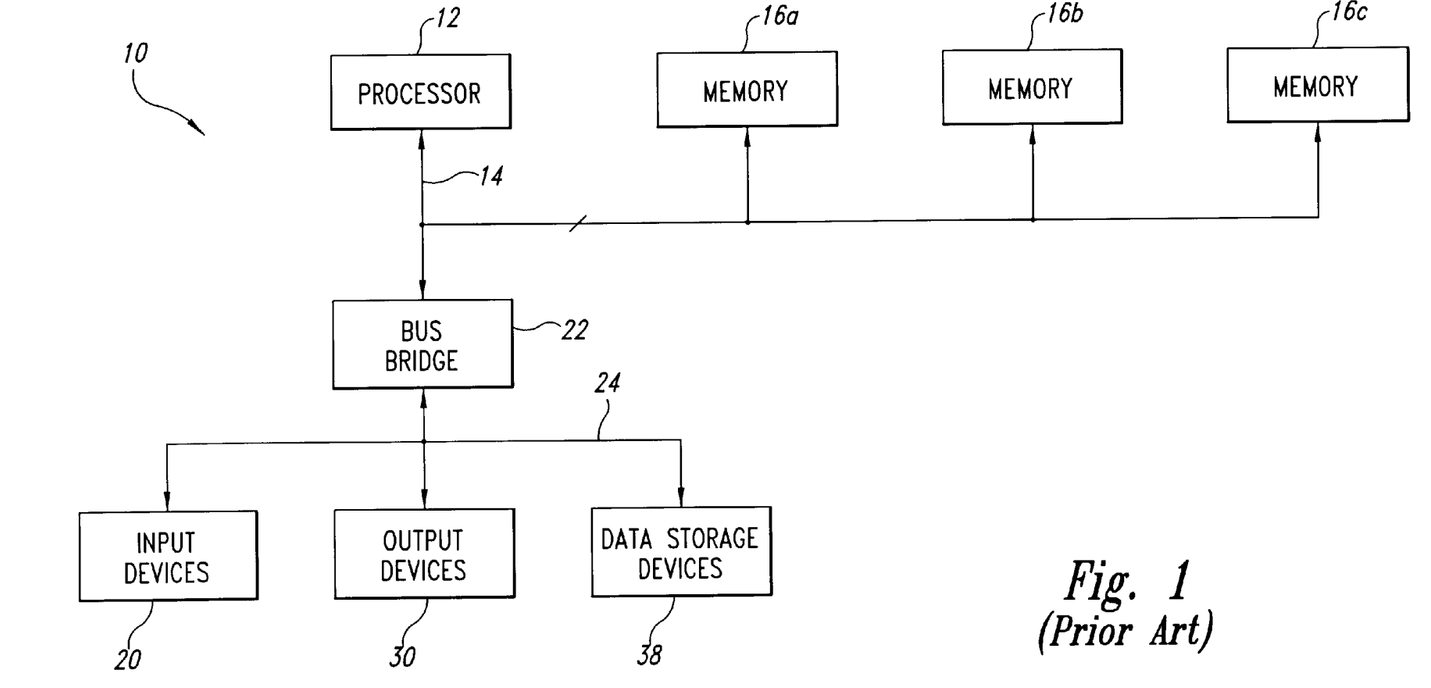
FIG. 1 is a block diagram of a computer system using SyncLink architecture.

An example of a computer system 10 using the SyncLink architecture is shown in FIG. 1. The computer system 10 includes a processor 12 having a processor bus 14 coupled to three packetized dynamic random access memory or SyncLink DRAM ("SLDRAM") devices 16a–16c. The computer system 10 also includes one or more input devices 20, such as a keypad or a mouse, coupled to the processor 12 through a bus bridge 22 and an expansion bus 24, such as an industry standard architecture ("ISA") bus or a peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives, floppy disk drives, tape cassettes, and compact-disc read-only memory (CDROM) drives.

In operation, the processor 12 communicates with the memory devices 16a–16c via the processor bus 14 by sending the memory devices 16a–16c command packets that contain both control and address information. Data is coupled between the processor 12 and the memory devices 16a–16c, through a data bus portion of the processor bus 14. Although all the memory devices 16a–16c are coupled to the same conductors of the processor bus 14, only one memory device 16a–16c at a time reads or writes data, thus avoiding bus contention on the processor bus 14. Bus contention is avoided by each of the memory devices 16a–16c and the bus bridge 22 having a unique identifier, and the command packet contains an identifying code that selects only one of these components.

The computer system 10 also includes a number of other components and signal lines which have been omitted from FIG. 1 in the interests of brevity. For example, as explained below, the memory devices 16a–16c also receive a master clock signal to provide internal timing signals, a data clock signal clocking data into and out of the memory device 16, and a FLAG signal signifying the start of a command packet.

Figure 2:
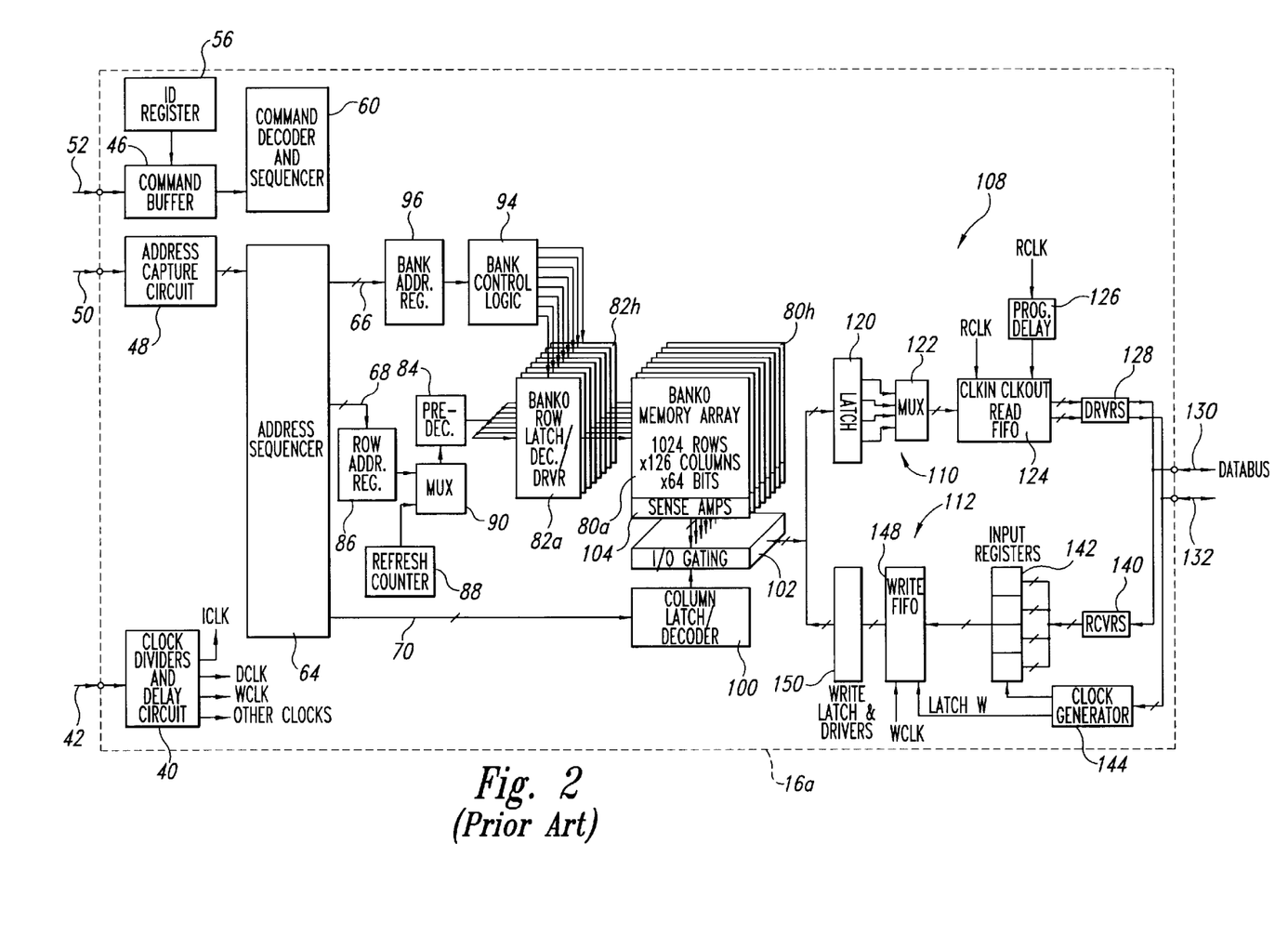
FIG. 2 is a block diagram of a packetized DRAM used in the computer system of FIG. 1 and including a multi-bank memory array.

The memory devices 16 are shown in block diagram form in FIG. 2. Each of the memory devices 16 includes a clock divider and delay circuit 40 that receives a master clock signal 42 and generates a large number of other clock and timing signals to control the timing of various operations in the memory device 16. The memory device 16 also includes a command buffer 46 and an address capture circuit 48 which receive an internal clock CLK signal, a command packet CD on a command bus 50, and a FLAG signal on line 52. As explained above, the command packet contains control and address information for each memory transfer, and the FLAG signal identifies the start of a command packet which may include more than one 10-bit packet word. In fact, a command packet is generally in the form of a sequence of 10-bit packet words on the 10-bit command bus 50. The command buffer 46 receives the command packet from the bus 50, and compares at least a portion of the command packet to identifying data from an identification ID register 56 to determine if the command packet is directed to the memory device 16a or some other memory device 16b, c. If the command buffer determines that the command is directed to the memory device 16a, it then provides a command word to a command decoder and sequencer 60. The command decoder and sequencer 60 generates a large number of internal control signals to control the operation of the memory device 16a during a memory transfer.

The address capture circuit 48 also receives the command words from the command bus 50 and outputs a 20-bit address corresponding to the address information in the command. The address information is provided to an address sequencer 64, which generates a corresponding 3-bit bank address on bus 66, a 10-bit row address on bus 68, and a 7-bit column address on bus 70.

One of the problems of conventional DRAMs is their relatively low speed resulting from the time required to precharge and equilibrate circuitry in the DRAM array. The packetized DRAM 16a shown in FIG. 2 largely avoids this problem by using a plurality of memory banks 80, in this case eight memory banks 80a–80h. After a memory read from one bank 80a, the bank 80a can be precharged while the remaining banks 80b–80h are being accessed. Each of the memory banks 80a–80h receives a row address from a respective row latch/decoder/driver 82a–82h. All of the row latch/decoder/drivers 82a–82h receive the same row address from a predecoder 84 which, in turn, receives a row address from either a row address register 86 or a refresh counter 88 as determined by a multiplexer 90. Bank control logic 94 activates only one of the row latch/decoder/drivers 82a–82h as a function of a bank address from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–80h through sense amplifiers 104. Data is coupled to or from the memory banks 80a–80h through the sense amplifiers 104 and I/O gating circuit 102 to a data path subsystem 108 which includes a read data path 110 and a write data path 112. The read data path 110 includes a read latch 120 receiving and storing data from the I/O gating circuit 102. In the memory device 16a shown in FIG. 2, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a read clock signal LATCHR generated from an internal clock by a programmable delay circuit 126. The FIFO buffer 124 sequentially applies the 16-bit words to a driver circuit 128 which, in turn, applies the 16-bit data words to a data bus 130 forming part of the processor bus 14.

The write data path 112 includes a receiver buffer 140 coupled to the data bus 130. The receiver buffer 140 sequentially applies 16-bit words from the data bus 130 to four input registers 142, each of which is selectively enabled by a write clock signal LATCHW from a clock generator circuit 144. Thus, the input registers 142 sequentially store four 16-bit data words and combine them into one 64-bit data word applied to a write FIFO buffer 148. The write FIFO buffer 148 is clocked by the write clock signal LATCHW from the clock generator 144 and an internal write clock WCLK to sequentially apply 64-bit write data to a write latch and driver 150. The write latch and driver 150 applies the 64-bit write data to one of the memory banks 80a–80h through the I/O gating circuit 102 and the sense amplifier 104.

As mentioned above, an important goal of the SyncLink architecture is to allow data transfer between a processor and a memory device to occur at a significantly faster rate. However, the operating rate of a packetized DRAM, including the packetized DRAM shown in FIG. 2, is limited by the time required to process command packets applied to the memory device 16a, the time required to generate control signals and the time required to read and write data to the banks 80a–h. More specifically, not only must the command packets be received and stored, but they must also be decoded and used to generate a wide variety of control signals. The control signals must then be communicated to the various circuitry for accessing the banks 80a–h. However, in order for the memory device 16a to operate at a very high speed, the command packets must be applied to the memory device 16a at a correspondingly high speed.

As the memory device receives and processes command packets at high speeds, the I/O gating circuit 102, sense amplifiers 104, and other circuitry for reading and writing to the memory banks 80a–80h produce internal command signals at very high speeds. These high speed command signals must be delivered to the circuitry associated with each of the eight banks 80a–80h. For example, command signals such as precharge and equilibrate are transmitted to the row latch/decoder/drivers 82a–82h from the decoder and sequencer 60. Delivery of all of the command signals to the eight banks 80a–80h can require several sets of signal lines, each extending from the command decoder and sequencer 60 to each of the latch/decoder/drivers 82a–82h associated with each of the eight memory banks 80a–80h. Each of the lines consume valuable area on a substrate and complicate routing of signal lines.

Additionally, the internal control signals require time to propagate from the command sequencer and decoder 60 to the various circuitry for accessing the banks 80a–h. Routing differences between the bank control logic 94 and the latch/decoder/drivers 82a–82h can therefore cause differences in the times at which the command signals reach the latch/decoder/drivers 82a–82h. These differences in arrival times can become significant at high speeds of operation and eventually limit the operating speed of the packetized DRAM.

SUMMARY OF THE INVENTION

A high speed memory device includes a plurality of banks that are accessed separately. Timing of operations within the memory device is controlled generally by a limited number of global control signals that are routed from a command sequencer and decoder to local timing circuits located near each of the individual banks. The local timing circuits receive the global signals and generate local control signals for reading to or writing from their respective banks in response to the global signals.

Because the control signals for each bank are generated locally, the number of signal lines extending from the sequencer and decoder to the banks is reduced. Also, because the relative timing of the control signals is established locally, deviations due to propagation delays between the sequencer and decoder and the bank are reduced.

In one embodiment of the local timing circuit, a corresponding first global command signal is received and latched by a latch circuit. The output of the latch circuit drives an inverter and delay circuit that produces an equilibrate signal.

A second global signal is derived from a delayed version of the first global signal. The delay between the first and second global signals is established by a row modeling circuit that models the response time of a row. The second global signal is then buffered to drive a first portion of a sense amplifier. The second global signal directly produces an I/O signal and also drives one input of a row driver. A delayed version of the second global signal then drives a second portion of the sense amplifier.

The global signals are directed to their respective local timing circuits by a comparing circuit responsive to a bank address. If the bank address does not match the address of the bank to which the local timing circuit corresponds, the comparing circuit blocks the global signals.

DETAILED DESCRIPTION OF THE INVENTION

Figure 3:
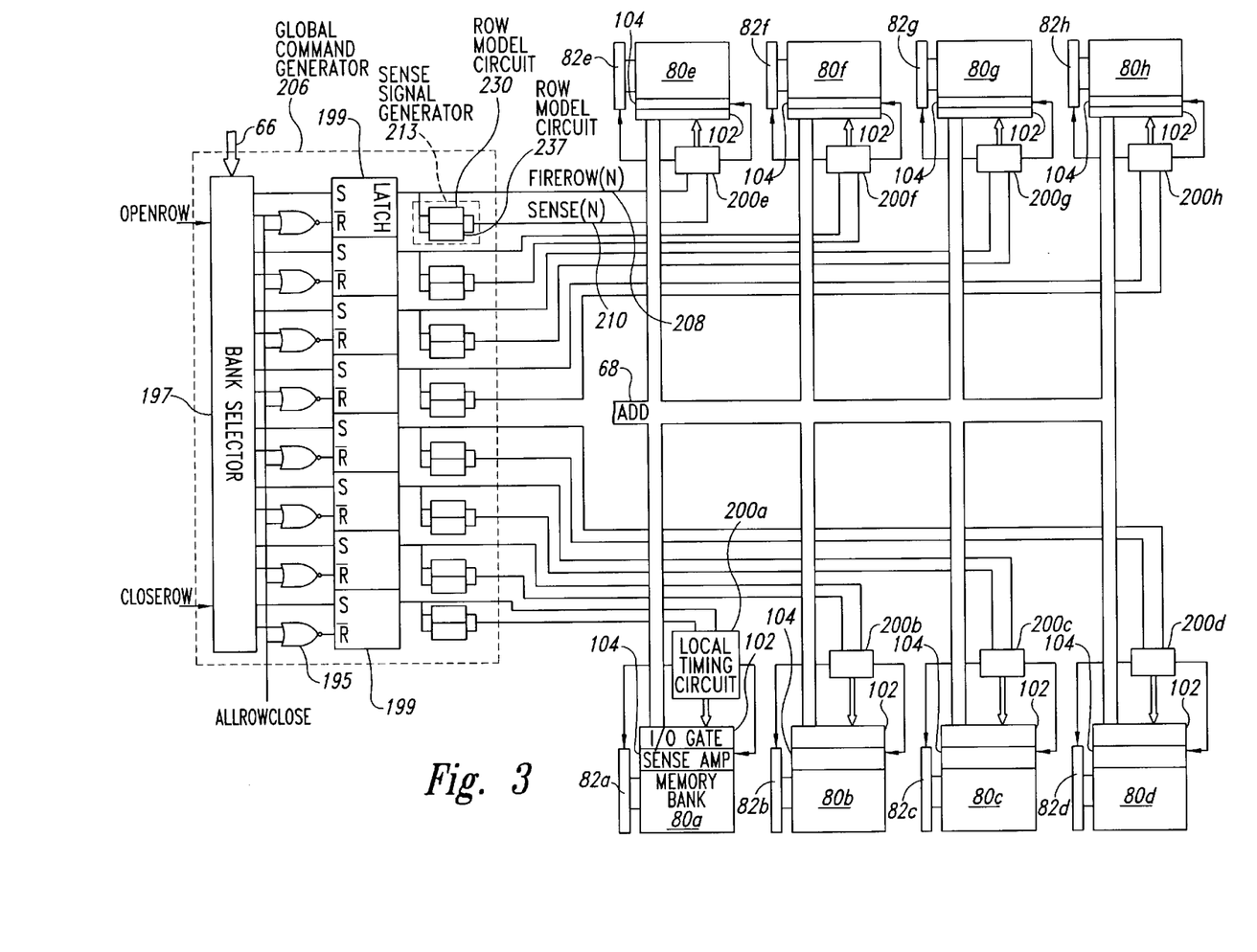
FIG. 3 is a schematic of a multi-bank memory array and related circuitry usable in the packetized DRAM of FIG. 2 including local timing control circuits.

FIG. 3 shows generally one embodiment of command signal paths and circuitry used to control reading and writing of the plurality of memory banks 80c–80h that are usable in the memory device 16 of FIG. 2 and the computer system 10 of FIG. 1. In this embodiment, the I/O gating circuit 102, sense amplifiers 104 and row latch/decoder/drivers 82c–82h for each bank 80a–80h of the multi-bank array are driven by a respective local timing circuits 200a–200h through a local control bus 202a–202h. Each of the local timing circuits 200a–200h is driven in turn by two respective global control signals FIREROW(N), SENSE(N) from a global command generator 206 within the sequencer and decoder 60. To distinguish signals directed to the banks 80a–80h from the global command generator 206, from signals generated at the local timing circuits 200a–200h, such as a bank-specific precharge signal, the signals directed from the global signal generator 206 will be referred to herein as global control signals while signals directed at one or very few banks will be referred to herein as local control signals. For example, the control signals FIREROW(N) and SENSE(N) in the embodiment described herein are global control signals while the precharge signal for a single bank 80a–80h is a local signal.

The global command generator 206 produces the global control signals FIREROW(N), SENSE(N) responsive to OPENROW and CLOSEROW commands from the command buffer 46 (FIG. 2), the 3-bit bank address from the bus 66 and the internal clock signal from the programmable delay circuit 126. Each of the signals FIREROW(N) is produced by a respective latch 199 responsive to high going transitions of an OPENROW signal and a CLOSEROW signal from the command buffer 46. To allow each of the latches 199 to be activated separately, the OPENROW signal is directed to the set input of only one of the latches 199 by a bank selector 197 controlled by the 3-bit bank address from the bus 66. The bank selector 197 also directs the CLOSEROW signal through a respective NOR gate 195 to the reset input of one of the latches 197. The outputs of the latches 197 form the respective FIREROW(N) signals.

The command buffer 46 can also supply an ALLROW-CLOSE signal to all of the NOR gates 195 to reset all of the latches 199 simultaneously. As will be described below, the resulting low-going transition of FIREROW(N) causes the local timing circuits 200a–200h to deactivate their respective banks 80a–80h. Thus, the command buffer 46 can close all of the banks 80a–80h with a single command.

Each sense signal SENSE(N) is produced in a sense signal generator 213 responsive to the respective FIREROW(N) by a row modeling circuit 230. The row modeling circuit 230 produces the sense signal SENSE(N) with a model delay $\tau_1$ relative to FIREROW(N) that is sufficient to allow the selected row to be charged to an active level. The row modeling circuit 230 is formed from a conductive line and input gates that approximate the response of the row line and the delays of the latch 218 (see FIG. 4), delay circuits 219, 222 and the inverter 220. The row modeling circuit 230 thus approximates the response time for charging a row of the array 80 in response to FIREROW(N). To more accurately model the row response, the conductive line is formed on the same substrate as the corresponding bank 80a–80h and is formed concurrently with the row lines in the bank 80a–80h. The row modeling circuit 230 therefore provides a relatively accurate indication of the amount of time required for the row driver 224 to charge its corresponding row to prepare for sensing.

Respective global signal lines 208, 210 carry the global internal control signals FIREROW(N), SENSE(N), respectively, from the global command generator 206 to each of the local timing circuits 200a–200h. As will be described below, most of the control signals for activating the banks 80a–80h are generated locally rather than at the global command generator 206, thereby allowing only two lines to carry control signals from the global command generator 206 to each of the various banks 80a–h. Routing problems and space consumption of control signal lines are thereby reduced. Also, because the local timing control circuits 200a–200h establish the timing of signals close to their respective banks 80a–80h, the local timing circuits 200a–200h reduce deviations in relative timing of signals caused by signal propagation delays between the sequencer and decoder 60 and the respective banks 80c–80h.

Figure 4:
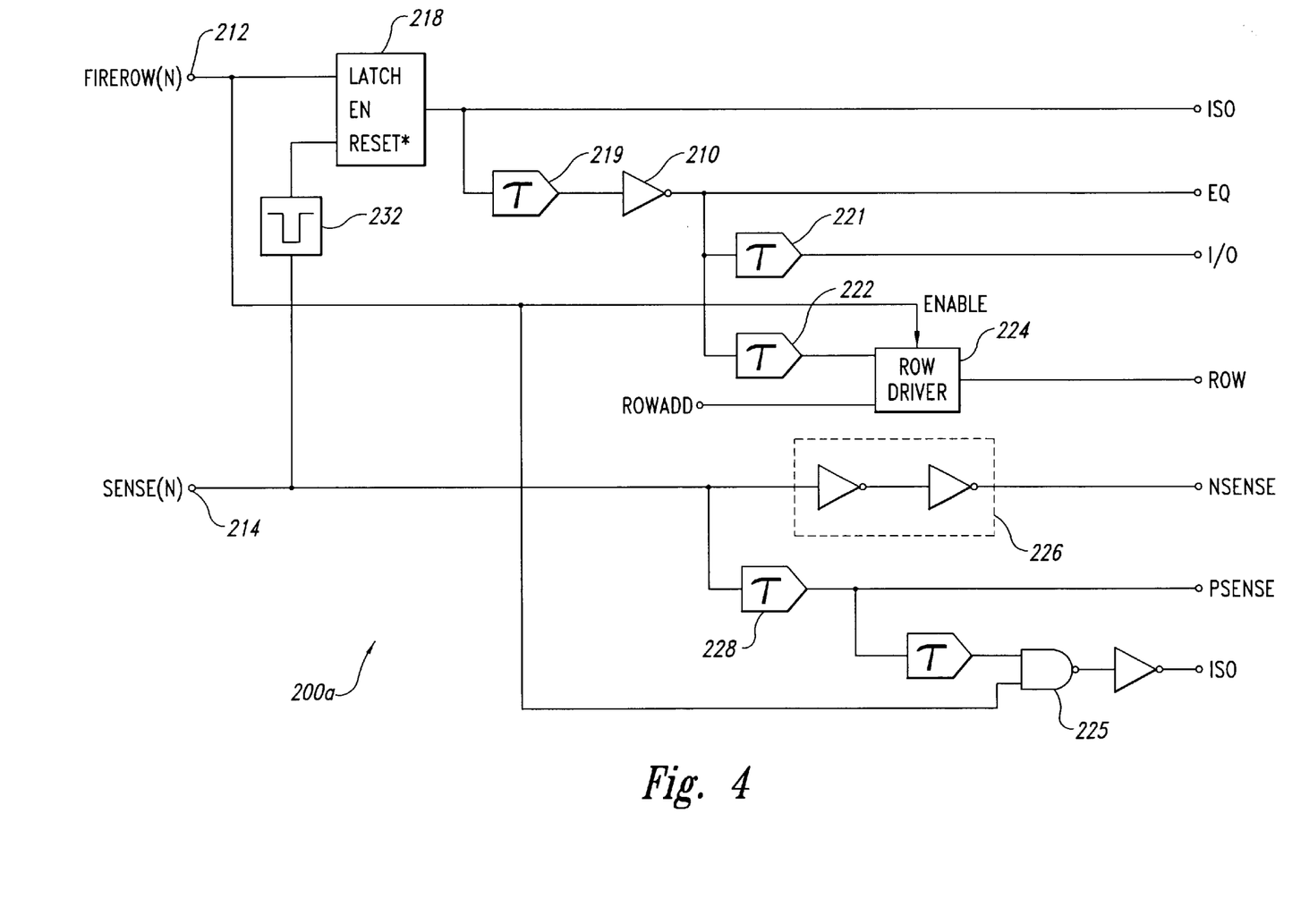
FIG. 4 is a schematic of one embodiment of a local timing control circuits within the multi-bank array of FIG. 3.

FIG. 4 shows one of the local timing control circuits 200a in greater detail. The local timing circuit 200a receives the respective global command signals FIREROW(N), SENSE (N) from the global command generator 206 at respective input terminals 212, 214.

Figure 5:
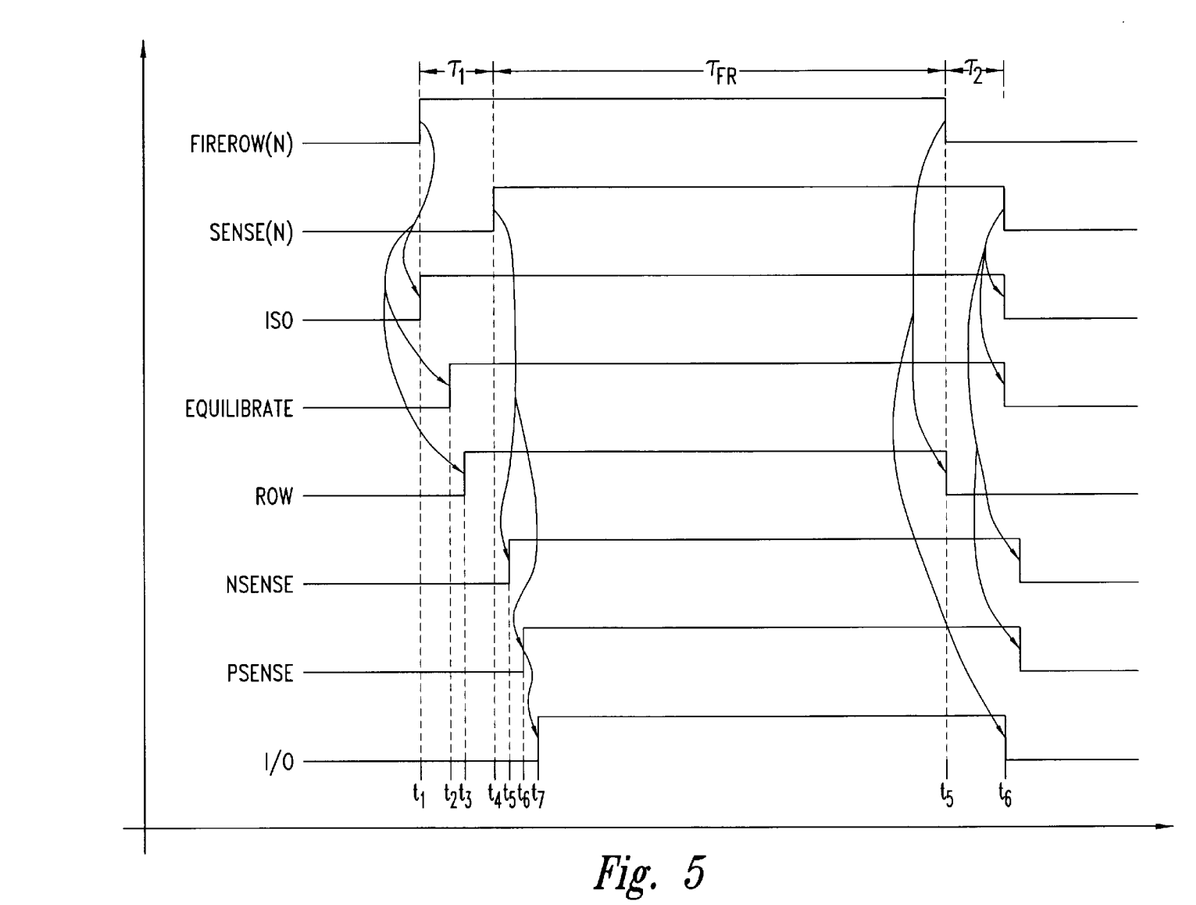
FIG. 5 is a signal timing diagram of a selected signals in the multi-bank array of FIG. 3.

Turning to the timing diagram of FIG. 5, when FIREROW (N) transitions high at $t_1$, it causes the output of a latch 218 to transition high. The latch output is applied directly to isolation gates in the I/O gating circuit 102 as an isolation signal ISO. Additionally, a delayed, inverted version of the latch output from a delay circuit 219 and an inverter 220 forms an equilibrate signal EQ that transitions low at time $t_2$. FIREROW(N) also directly enables an I/O NAND gate 225. However, the output of the NAND gate 225 does not change until after the sense signal SENSE(N) transitions, as described below.

At time $t_3$, a version of the equilibrate signal EQ, delayed by a delay gate, enables a row driver 224 within the row latch/decoder/driver 82a–82h. If the row is selected (through row address signal ROWADD), the row driver 224 provides a row driving signal ROWN that activates a row of the bank 80a.

The sense signal SENSE transitions high responsive to the row modeling circuit 230 in the sense signal generator 213 (see FIG. 3) at time $t_4$ and indicates that sufficient time has passed to properly charge the corresponding row. The sense signal SENSE is buffered by an inverter pair 226 and directly activates N-sense portions of the sense amplifiers 104 at time $t_5$ to begin reading data from the bit lines. After a slight delay from a delay gate 228, the sense signal SENSE then activates the P-sense portions of the sense amplifiers 104 at time $t_6$ to complete reading of data from the digit lines. The delayed sense signal SENSE is then further delayed at a delay gate 229 to send the output of the I/O NAND gate 225 low. The low-going output of the I/O NAND gate 225 is then inverted to produce a high-going I/O signal I/O at time $t_7$.

After time $t_6$, FIREROW(N) remains high for a period $\tau_{FR}$ which is defined by the command sequencer and decoder 60 responsive to a command word from an earlier command packet. The period $\tau_{FR}$ is sufficient to allow the sense amplifiers 104 to read the digit lines and for the signals from the sense amplifiers to be latched by the latch 120 (FIG. 2). Typically, the period $\tau_{FR}$ is established upon initialization of the memory device 16.

At the end of the interval $\tau_{FR}$, FIREROW(N) transitions low, thereby disabling the row driver 224 and the I/O gating. The remaining local control signals remain high, because the output of the latch 218 remains high. The high-to-low transition of FIREROW(N) also activates a row discharge model 233 in the sense signal generator 213 that models the time $\tau_2$ necessary to properly discharge the activated row. After the discharge time $\tau_2$, the row discharge model 233 causes the sense signal SENSE to transition low at time $t_6$. The low-going sense signal SENSE(N), through the buffer 226 and delay gate 228, deactivates the N-sense and P-sense portions of the sense amplifiers 104. Additionally, a high-to-low transition detector 232 detects the low going transition of the sense signal SENSE and resets the latch 218 in response. The output of the latch 218 transitions low, thereby causing the isolation signal ISO and the equilibration signal EQ to transition low. The row signal is already low, because the previous transition of FIREROW(N) disabled the row driver 224, as described above.

From the foregoing it will be appreciated that, although specific embodiments of the invention have been described herein for purposes of illustration, various modifications may be made without deviating from the spirit and scope of the invention. One skilled in the art will recognize that the specific timing of the local control signals may vary depending upon the specific requirements of the memory device 16. For example, it may be desirable to activate the P-sense amplifiers prior to the N-sense amplifiers. Accordingly, the invention is not limited except as by the appended claims.

What is claimed is:

1. A method of transferring data to or from a memory device having a plurality of physically spaced-apart memory banks each of which corresponds to a respective bank address, the method comprising:

receiving a command signal;

receiving a bank address;

generating one of a plurality of global control signals responsive to the command signal and the bank address;

coupling the generated global control signal to the memory bank corresponding to the received address;

receiving the global control signal at the memory bank corresponding to the received address;

generating a plurality of local control signals at the memory bank corresponding to the received address responsive to the received global control signal, the local control signals having predetermined timing relationships;

coupling the local control signals to the memory bank corresponding to the received address, transferring data to or from the memory bank corresponding to the bank address in response to the local control signals.

2. The method of claim 1, further comprising simultaneously generating a plurality of global control signals responsive to a predetermined command signal, and coupling each of the plurality of global control signals to a respective one of the memory banks.

3. The method of claim 1 wherein the plurality of local control signals comprise a precharge signal having a first voltage transition at a first time and an equilibrate signal having a second voltage transition at a second time different from the first time.

4. The method of claim 1 wherein the plurality of local control signals comprise at least one sense amplifier activating signal.

5. The method of claim 1 wherein the command signal comprises an openrow control signal that is operable to cause local control signals to be generated that activate a row of memory cells at the memory bank corresponding to the received bank address.

6. The method of claim 1 wherein the command signal comprises a closerow control signal that is operable to cause local control signals to be generated that deactivates a row of memory cells at the memory bank corresponding to the received bank address.

7. The method of claim 1 wherein the act of generating one of a plurality of global control signals responsive to the command signal and the bank address comprises latching the command signal in one of a plurality of latches each of which corresponds to respective bank addresses.

8. The method of claim 1 further comprising generating a second global control signal from each of the global control signals generated responsive to the command signal and the bank address.

9. The method of claim 8 wherein the act of generating a second global control signal comprises delaying a respective one of the global control signals generated responsive to the command signal and the bank address.

10. The method of claim 9 wherein the act of generating a second global control signal comprises delaying a respective one of the global control signals by a time delay corresponding to the time required to couple the respective one of the global control signals to the respective memory bank.

11. A method of accessing a memory array including a plurality of memory banks, comprising:
   receiving a command signal;
   receiving a bank address;
   producing a first global control signal including a first transition in response to the command signals and producing a second global control signal from the first global control signal;
   directing the first and second global control signals to one of a plurality of local control circuits located proximate and coupled to a memory bank corresponding to the received bank address; and
   generating a first set and a second set of local control signals at the local control circuit responsive to receipt of the first and second global control signals, the first and second local control signals causing an access to the memory bank to which the local control circuit is coupled.

12. The method of claim 11 wherein the act of directing the first and second global control signals to one of a plurality of local control circuits comprises:
   comparing the received bank address to an address of the bank to which each of the local control circuits is coupled; and
   if the received bank address matches the address of the bank to which the local control circuit is coupled, directing the first and second global control signals from to the local control circuit that is coupled to the bank having an address matching the received bank address.

13. The method of claim 11 wherein each of the local control circuits includes a latch circuit and the receiving of the first and second global control signals at the first local control circuit includes latching the first global control signal.

14. The method of claim 11, further comprising writing data to or reading data from the bank in response to the local control signals.

15. The method of claim 11 wherein the acts of generating a first and second set of local control signals comprises generating a row activation signal.

16. The method of claim 11 wherein the acts of generating a first and second set of local control signals comprises generating a precharge signal at a selected delay following the latching of the first global control signal.

17. The method of claim 11, further comprising activating sense amplifiers in response to the second set of local control signals.

18. The method of claim 11 wherein the act of generating the second global control signal comprises:
   receiving the first global control signal at a delay circuit; and
   outputting the second global control signal from the delay circuit responsive to the first global control signal.

19. A method of accessing a selected one of a plurality of memory banks in a memory device responsive to an address, including a bank address, comprising:
   coupling respective local control circuits to each of the memory banks, the local control circuits being located proximate the respective memory banks;
   receiving a bank address indicating one of the local control circuits;
   coupling the indicated one of the local control circuits to a global control circuit;
   generating a global signal at the global control circuit;
   at the indicated local control circuit, generating a plurality of local control signals in response to the global signal; and
   reading data from or writing data to the bank to which the indicated local control circuit is coupled responsive to the local control signals.

20. The method of claim 19, further comprising latching the global signal at the indicated local control circuit.

21. The method of claim 19 wherein one of the local control signals comprises a precharge signal.

22. The method of claim 19, further comprising:
   at the indicated local control circuit, generating a sensing signal responsive to the global signal; and
   activating a set of sense amplifiers responsive to the sensing signal.

23. A memory device comprising:
   a memory array having a plurality of physically separated memory banks;
   a global control circuit configured to produce a global control signal;
   a plurality of local control circuits, each being physically proximate and coupled to a respective one of the memory banks, each of the local control circuits being operable to activate a selected row of the respective memory bank in response to receiving the global control signal; and
   a bank selector circuit coupled between the global control circuit and each of the local control circuits through a respective global signal line extending between the bank selector circuit and each of the local control circuits, the bank selector circuit being operable to couple the global control signal to a local control circuit designated by a bank address.

24. The memory device of claim 23, further comprising a plurality of global latch circuits included in the global control circuit serially coupled with respective global signal lines between the global control circuit and the respective local control circuits, the global latch circuits being configured to transmit the global control signal to a selected local control circuit in response to the bank address.

25. The memory device of claim 23 wherein each of the local control circuits includes a latch responsive to the global control signal to produce a latched output signal, wherein activation of the selected row is responsive to the latched output signal.

26. The memory device of claim 25 wherein the bank address includes a plurality of bank address bits and wherein the bank selector circuit is operable to compare the bank address bits to a bit pattern corresponding to a respective bank and to activate the global latch circuit in the global control circuit when the bank address bits match the bit pattern.

27. A computer system comprising:
   a processor;
   an input device coupled to the processor;
   an output device coupled to the processor;
   a data storage device coupled to the processor; and
   a memory device coupled to the processor, the memory device comprising:

a memory array having a plurality of physically separated memory banks;

a global circuit configured to produce a global control signal;

a plurality of local control circuits, each being physically proximate and coupled to a respective one of the memory banks, each of the local control circuits being operable to activate a selected row of the respective memory bank in response to receiving the global control signal; and a bank selector circuit coupled between the global control circuit and each of the local control circuits through a respective global signal line extending between the bank selector circuit and each of the local control circuits, the bank selector circuit being operable to couple the global control signal to a local control circuit designated by a bank address.

28. The computer system of claim 27 wherein the memory device comprises a dynamic random access memory.

29. The computer system of claim 27, further comprising a plurality of global latch circuits included in the global control circuit serially coupled with respective global signal lines between the global control circuit and the respective local control circuits, the global latch circuits being configured to transmit the global control signal to a selected local control circuit in response to a bank address.

30. The computer system of claim 27 wherein each of the local control circuits includes a latch responsive to the global control signal to produce a latched output signal, wherein activation of the selected row is responsive to the latched output signal.

31. The computer system of claim 30 wherein the bank address includes a plurality of bank address bits and wherein the bank selector circuit is operable to compare the bank address bits to a bit pattern corresponding to a respective bank and to activate the global latch circuit in the global control circuit when the bank address bits match the bit pattern.

* * * * *